United States Patent [19]
Ishihara et al.

[11] Patent Number: 5,936,346
[45] Date of Patent: Aug. 10, 1999

[54] PROCESS FOR THE PRODUCTION OF ELECTROLUMINESCENCE ELEMENT, ELECTROLUMINESCENCE ELEMENT

[75] Inventors: Hajime Ishihara, Nagoya; Yutaka Hattori, Okazaki; Masayuki Katayama, Handa; Nobuei Ito, Chiryu; Tadashi Hattori, Okazaki, all of Japan

[73] Assignees: Nippondenso Co., Ltd., Kariya; Research Development Corporation of Japan, Tokyo, both of Japan

[21] Appl. No.: 09/026,180

[22] Filed: Feb. 19, 1998

Related U.S. Application Data

[62] Division of application No. 08/300,552, Sep. 7, 1994.

[30] Foreign Application Priority Data

Sep. 9, 1993 [JP] Japan ................................. 5-250063
Sep. 9, 1993 [JP] Japan ................................. 5-250064
Dec. 17, 1993 [JP] Japan ................................. 5-344343

[51] Int. Cl.$^6$ ........................................................ H01J 1/62
[52] U.S. Cl. ........................... 313/506; 313/503; 313/511; 313/512
[58] Field of Search ................................. 313/506, 498, 313/502, 503, 505, 509, 511, 512

[56] References Cited

U.S. PATENT DOCUMENTS 4,508,610  4/1985  Freeman ........................... 204/192.26
4,675,092  6/1987  Baird ................................. 204/192.29
4,707,419  11/1987  Ogura ....................................... 428/690
5,369,333  11/1994  Inoguchi ................................. 313/509

FOREIGN PATENT DOCUMENTS 59-92995   5/1984  Japan .
59-119697  7/1984  Japan .
63-6773    1/1988  Japan .
63-230869  9/1988  Japan .
2 94288    4/1990  Japan ............................... 204/192.26

OTHER PUBLICATIONS

Ohwaki et al., "High–Brightness Blue, Red, and Stable Green Thin–Film Electroluminescent Devices", *Electrical Communications Laboratories*, 1987, pp. 811–818.

Hirabayashi et al., "Color Electroluminescent Devices Prepared by Metal Organic Chemical Vapor Deposition", *Japanese Journal of Applied Physics*, Sep., 1987, vol. 26, No. 9, pp. 1472–1476.

*Primary Examiner*—Vip Patel
*Attorney, Agent, or Firm*—Pillsbury Madison & Sutro

[57] ABSTRACT

An electroluminescence element provided with a luminescent layer sandwiched between two electrodes on an insulating substrate. The luminescent layer is composed of zinc sulfide with a fluoride or a luminescent center element added, wherein the X-ray diffraction spectrum thereof has only a single peak at an X-ray diffraction angle from the luminescent layer, ranging from 25° to 30° according to a thin film X-ray diffraction measurement method using Cu-Kd radiation, and no other peaks of the X-ray diffraction spectrum exist at an X-ray diffraction angle of 27°.

4 Claims, 14 Drawing Sheets

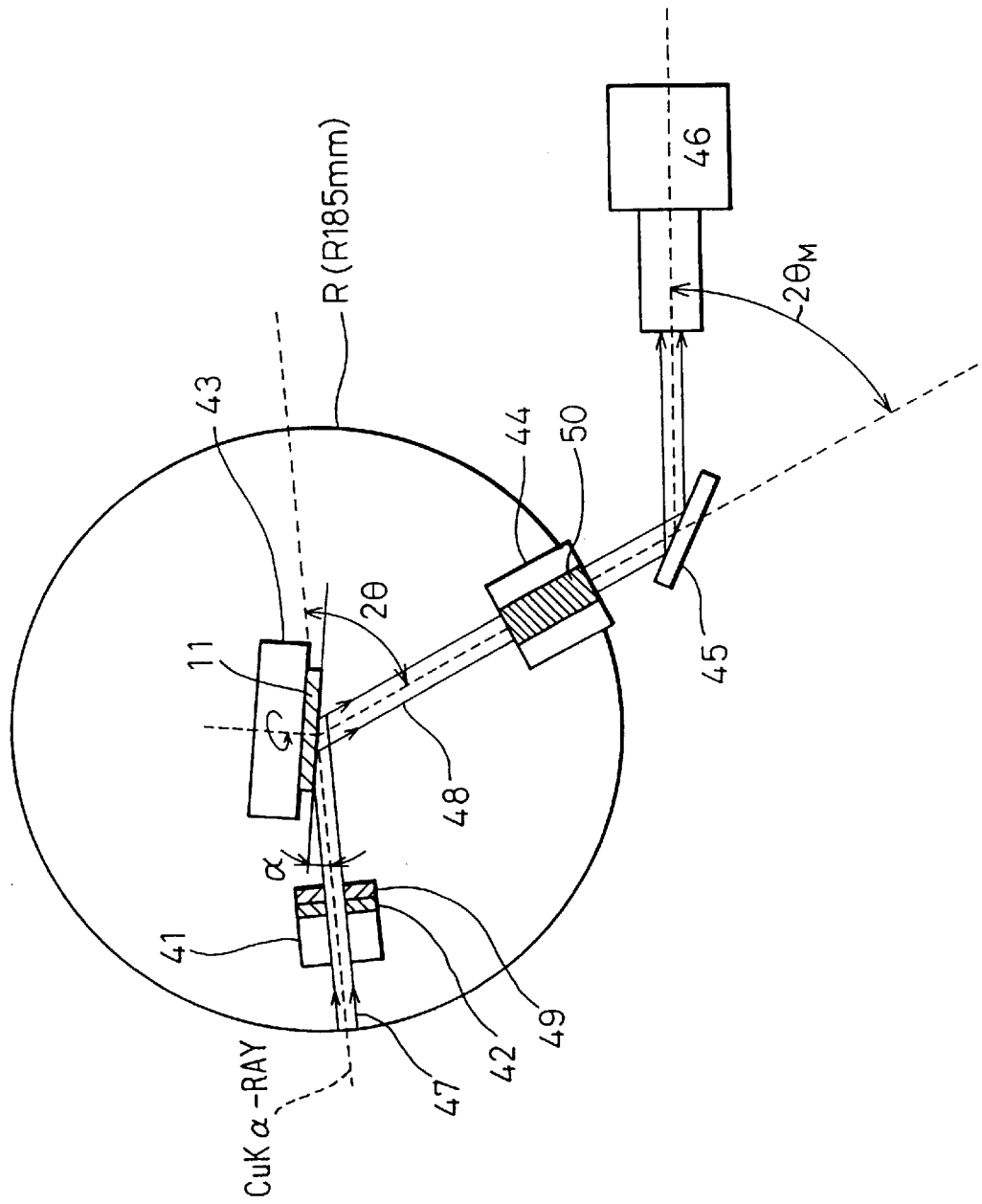

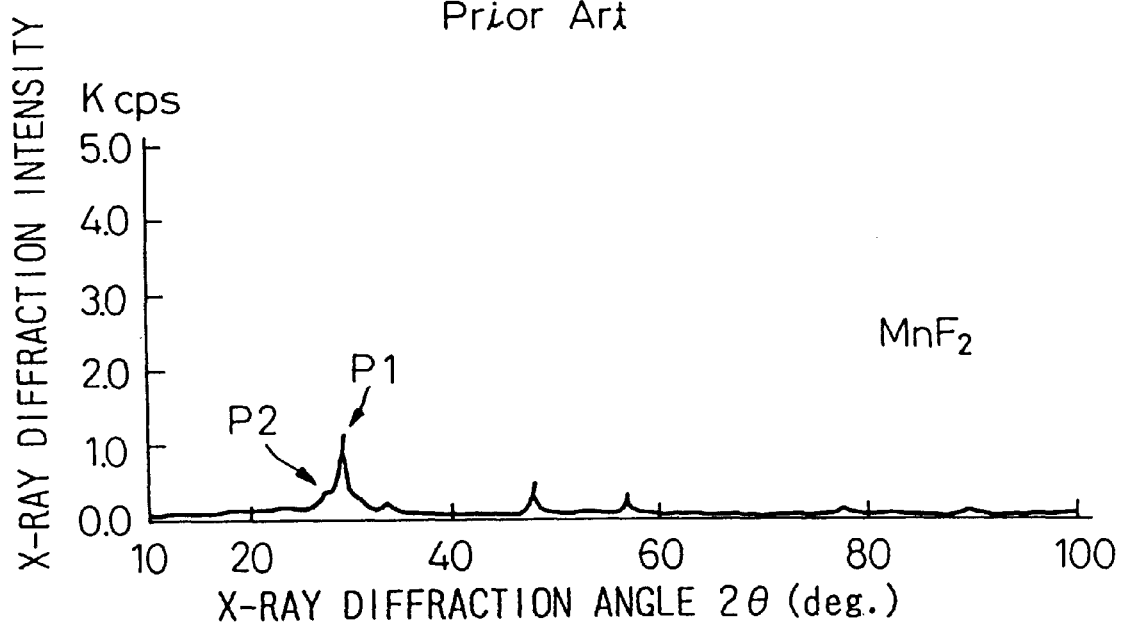

PROCESS FOR THE PRODUCTION OF ELECTROLUMINESCENCE ELEMENT, ELECTROLUMINESCENCE ELEMENT

This is a division of application Ser. No. 08/300,552, filed Sep. 7, 1994.

BACKGROUND OF THE INVENTION

1. Field of the Invention

The present invention relates to an electroluminescence element (hereinafter referred to as "EL element"), especially a thin-film EL element, used for spontaneously light-emitting segment displays or matrix displays of measuring instruments or displays of various information terminal equipment. The present invention relates also to an element, especially an EL element capable of emitting high luminance light.

2. Description of the Related Art

An EL element utilizes the phenomenon that a fluorescent substance emits light when a high electric field is impressed thereon, and has hitherto become the object of public attention as a product constituting a spontaneously light-emitting flat panel display. As an example of such an EL element, FIG. 7 is a typical view illustrating a typical sectional structure of a conventional EL element. The EL element is formed by laminating a first electrode 2 composed of an optically transparent ITO (Indium Tin Oxide) film, a first insulating layer 3 composed of tantalum pentaoxide ($Ta_2O_5$) and the like, a luminescent layer 4, a second insulating layer, and a second electrode 6 composed of a ITO film, in the named order. An ITO film is a transparent conductive film prepared by doping tin (Sn) on indium oxide ($In_2O_3$) and has hitherto been widely used for a transparent electrode, because of its low resistivity. In addition, as the luminescent layer 4, there is used, e.g., a product having zinc sulfide as a host material, to which manganese (Mn) or terbium (Tb) has been added as a luminescent center. The luminescent color is determined by the kind of an additive contained in zinc sulfide, and for example, when manganese (Mn) is added as a luminescent center, there is obtained yellowish orange luminescence, and when terbium (Tb) is added as a luminescent center, there is obtained green luminescence.

In EL elements composed of the aforesaid structure, there have been reviewed zinc sulfide (ZnS) with samarium (Sm) as a luminescent center of the luminescent layer capable of obtaining red luminescence therefrom, and zinc sulfide (ZnS) with thulium (Tm) added as a luminescent center of the luminescent layer capable of obtaining blue luminescence therefrom, and so forth. In general, a zinc sulfide (ZnS) luminescent layer with a rare earth metal added is formed by the sputtering method or evaporation method.

However, in a red EL element with samarium (Sm) added or blue EL element with thulium (Tm) added, its luminescence brightness exhibits a very low value of 1000 $cd/m^2$ (driven at a frequency of 5 KHz ) for red luminescence and of 10 $cd/m^2$ (driven at a frequency of 5 KHz) for blue luminescence, and under the present situation, such an EL element is poor in practicality for a display such as EL panel. As the reason why sufficient luminance cannot be obtained, there may be considered that, in a luminescent layer formed by the sputtering method or evaporation method, the crystallinity of zinc sulfide (ZnS) with a rare earth element added is poor. That is, in an EL element with samarium (Sm) or thulium (Tm) added, the energy interval between the luminescence excitation level and the level just below is small, as compared with a green EL element with terbium (Tb) added in which a comparatively high brightness has been obtained by use of the sputtering method or evaporation method, so that a non-luminescent multiphonon-emission process tends to compete with and dominate the luminescence transition. Therefore, in an EL element with samarium (Sm) and thulium (Tm) added, it is indispensable to improve the crystallinity of zinc sulfide (ZnS) and reduce the aforesaid non-luminescent transition process. Thus, as a means of improving the crystallinity of zinc sulfide (ZnS) with a rare earth element added, annealing after film formation of a luminescent layer and the like has been performed, but under the present situation, such a means has not exhibited a sufficient effect in zinc sulfide with samarium (Sm) and thulium (Tm) added. As another cause for the lowering of the crystallinity of zinc sulfide (ZnS), there may be mentioned difficulty in replacement of the rare earth element at zinc (Zn) site. The reason therefor is that zinc is different from a rare earth element in ionic radius and valency. For example, the ionic radius of zinc (Zn) is 0.074 nm, whereas that of samarium (Sm) and that of thulium (Tm) are, respectively, 0.096 nm and 0.087 nm, that of the former being different from those of the latter two by approximately twenty to thirty percent. In addition, the valency of zinc (Zn) is divalent, whereas that of a rare earth element is trivalent. Usually, in the luminescent layer of an EL element, a rare earth element is added as a luminescent center in a proportional amount ranging from 0.1 to 1.0 atomic % based on zinc sulfide (ZnS). Consequently, if the zinc is not replaced by the rare earth element to a sufficient degree, a negative influence is exerted upon the crystal lattice, resulting in noticeable lowering of the crystallinity of the luminescent layer. As a result, the acceleration of the carrier in the luminescent layer due to the electric field is impeded, and the probability of the non-luminescent transition process is also increased, resulting in lowering of luminance.

On the other hand, in order to improve the luminescent efficiency and brightness, there has hitherto been proposed a method of controlling the composition ratios of a rare earth element and a halogen element contained in a luminescent layer, as described in, e.g., Japanese Unexamined Patent Publication No. 63-230869. In this literature, there is disclosed a process in which, when forming a luminescent layer composed of a compound of an element belonging to Group II of the Periodic Table and an element belonging to Group VI of the Periodic Table by the sputtering method or evaporation method, a gas containing a halogen element or a halide is used as a reaction gas. However, the process disclosed in this literature of prior art is complicated as a production process, because there are used two kinds of evaporation sources: an evaporation source composed of a compound of an element of Group II and an element of Group VI of the Periodic Table and an evaporation source composed of a sulfide of a rare earth element. In addition, this conventional process is a process in which only the composition ratios of the rare earth element and halogen element contained in a luminescent layer are controlled, and according to this process, there cannot be expected improvement of the crystallinity of a luminescent layer by efficient replacement of a luminescent center element.

In addition, there has been known a report to the effect that, in general, when the crystallinity of a luminescent layer is improved, the luminescence brightness can be also improved. Specifically, with respect to the crystallinity and luminescence characteristics of a luminescent layer of an EL element in the evaporation method, there is known "Multi-colorisation and Life-Elongation of Thin-Film EL Element"

in Report on the Developments of Researches Vol. 36, No. 6 (1987) P811–818 (or Japanese Journal of Applied Physics, Vol. 26, No. 9, September, 1987, pp1472–1476), and it is therein described to the effect that, in a product containing zinc sulfide as a host material, to which samarium fluoride is added as a luminescent center, (ZnS—SmF$_3$), with the increase of the concentration of the luminescent center (SmF$_3$), the diffraction line intensity of the cub-ZnS (111) plane (cub means a cubic structure) per unit film thickness "d", i.e. I $_{(111)}$/d is reduced. That is, the more the concentration of a luminescent center becomes increased, the lower becomes the crystallinity of the ZnS—SmF$_3$ luminescent center. In addition, in, e.g., a report entitled "Crystal Structure Control of ZnS: Tb Film by Bypass Flow Low Pressure CVD Method" in Research Materials of the 6-th EL Sectional Meeting of the 125-th Photoelectric Intertransformation Committee of the Japan Society for the Promotion of Science (Nov. 19, 1991) p7–p14, it is described that the crystal structure in the CVD method can be controlled not only with a carrier HCl gas but with a bypass-flow HCl gas.

However, with respect to a process for the production of an EL element by the sputtering method excellent in productivity among the conventional processes, there has never been reported a specific production process capable of obtaining high luminance, and a practical high luminance EL element by the sputtering method has not been realized. Under such technical circumstances, the present inventors formed a luminescent layer with a fluoride of a luminescent center element added as a luminescent center into a film on zinc sulfide (ZnS) as a host material by the sputtering method, so as to produce an EL element, and measured the X-ray diffraction spectrum of the thus produced EL element by an ordinary X-ray diffraction method, and found that, as illustrated in FIG. 14, a main peak was exhibited at an X-ray diffraction angle (2θ) of 28.5°. From this X-ray diffraction result, it was considered that, since the luminescent layer of this element is composed only of a cubic structure (that is, any other crystal structure such as hexagonal structure is not mixed), the crystallinity is very good.

However, when the luminance of this EL element was actually measured, it was found that the actually measured luminance is lower than the luminance expected from the crystallinity. It is presumed from this fact that, in reality, the crystallinity of the luminescent layer will be poorer than the actually measured crystallinity.

SUMMARY OF THE INVENTION

An object of the present invention is to provide a process for the production of a high brightness EL element excellent in crystallinity, having a luminescent layer, with good reproducibility, by efficient replacement of a luminescent center element with an element belonging to Group II of the Periodic Table (zinc (Zn) element in the aforesaid example), in which said luminescent layer is formed by use of only one source material composed of a compound of an element of Group II and an element of Group VI of the Periodic Table, to which a halide of a rare earth element is added, in order to solve the aforesaid problems.

Another object of the present invention is to provide a process for the production of a high luminance EL element excellent in crystallinity with good reproducibility, by efficient replacement of a luminescent center element with an element of Group II (zinc (Zn) element in the aforesaid example).

Still another object of the present invention is to provide a high luminance EL element by improvement of the crystallinity of a luminescent layer, when forming said luminescent layer as a film by the sputtering method, a process for the production of the EL element, and an evaluation method therefor.

According to the first aspect, the present invention provides, therefore, a process for the production of an electroluminescence element with a luminescent layer sandwiched between two electrodes on an insulating substrate, said luminescent layer being composed of a compound of an element of Group II and an element of Group VI, to which a luminescent center element is added, which comprises a step of forming the aforesaid luminescent layer as a film onto the aforesaid insulating substrate by either sputtering or evaporation by use of a source material composed of the aforesaid compound of an element of Group II and an element of Group VI, to which a halide of a rare earth element is added as the aforesaid luminescent center element, wherein the atmosphere at the time of the aforesaid film formation contains a halogen gas or halide gas.

According to the second aspect, the present invention provides a process for the production of an electroluminescence element with a luminescent layer sandwiched between two electrodes on an insulating substrate, said luminescent layer being composed of a compound of an element of Group II and an element of Group VI, which comprises a step of forming the aforesaid luminescent layer as a film onto the aforesaid insulating substrate by either means of sputtering and evaporation, by use of a source material composed of the aforesaid compound of an element of Group II and an element of Group VI, to which a fluoride or fluorine compound of the aforesaid luminescent center element and a halide other than fluoride of the aforesaid element of Group II are added.

In the third aspect, the present invention provides a process for the production of an electroluminescence element with a luminescent layer sandwiched between two electrodes on an insulating substrate, said luminescent layer being composed of a host material with a luminescent center element added, which comprises a step of pretreating a film formation atmosphere by introducing a chlorine-containing gas into the growth chamber prior to the film formation of the aforesaid luminescent layer, and a step of depositing the aforesaid luminescent layer onto the aforesaid insulating substrate by the sputtering method that uses a source material composed of the aforesaid host material with the aforesaid luminescent center element added.

In the fourth aspect, the present invention provides an electroluminescence element with a luminescent layer sandwiched between two electrodes on an insulating substrate, said luminescent layer being composed of zinc sulfide with a fluoride of a luminescent center element added, wherein, at an X-ray diffraction angle from the aforesaid luminescent layer, ranging from 25° to 30°, according to a thin film X-ray diffraction measuring method by use of Cu-Kd radiation, the X-ray diffraction spectrum has only one peak, and at an X-ray diffraction angle of approximately 2°, no other peaks exist.

BRIEF DESCRIPTION OF THE DRAWINGS

FIG. 10 is a rough sketch illustrating the structure of a thin film X-ray diffraction device.

FIG. 18 is a thin film X-ray diffraction spectrum pattern of the luminescent layer of an EL element whose luminescent center material is $MnF_2$, when the pretreatment according to the present invention is not performed.

DESCRIPTION OF THE PREFERRED EMBODIMENTS

Figure 1:
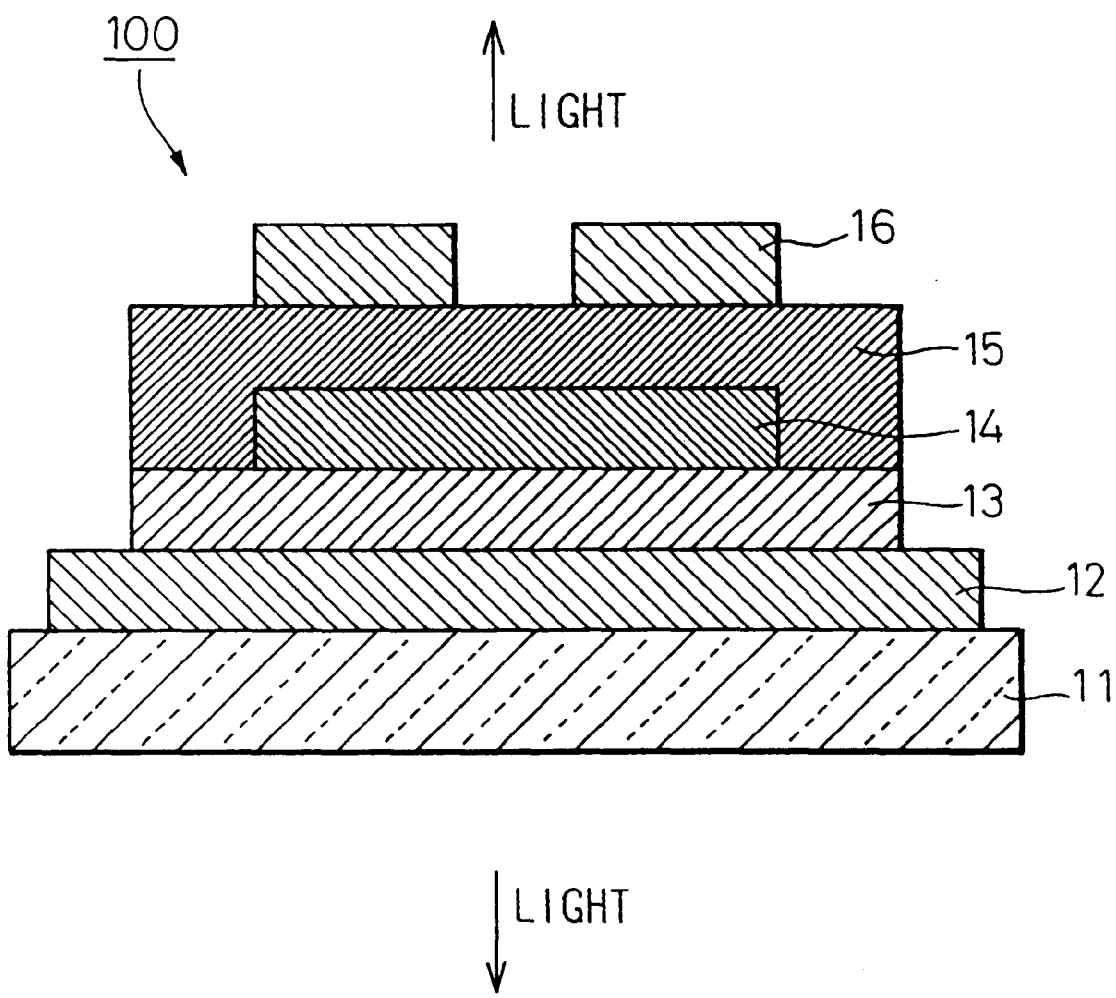
FIG. 1 is a typical cross-sectional view of an EL element according to the present invention.

In the process according to the first aspect of the present invention, the aforesaid halogen gas is preferably a chlorine gas, and the aforesaid halide gas is preferably hydrogen chloride gas, vaporized chlorinated compound, hydrogen bromide gas, or hydrogen iodide gas, and the aforesaid atmosphere at the time of film formation is selected as at least one of these halogen gases and halide gases.

The aforesaid rare earth element is selected preferably from the group consisting of samarium, thulium, and terbium, and the halide of the aforesaid rare earth metal is preferably samarium trifluoride.

Preferably, the aforesaid compound of an element of Group II and an element of Group VI may be zinc sulfide.

The partial pressure ratio of the aforesaid halogen gas or the aforesaid halide gas to the aforesaid film formation atmosphere is preferably within the range between 0.001 and 0.02, and letting the partial pressure of the aforesaid halogen gas or the aforesaid halide gas be "a" and pressure of the aforesaid film formation atmosphere at the time of forming a film be "b", the product value of "a" and "b" is preferably within the range between 0.016 ($Pa^2$) and 0.035 ($Pa^2$).

In addition, in the case of the aforesaid luminescent layer being formed as a film onto the aforesaid insulating substrate, the temperature of said insulating substrate is desirably within the range between 150° C. and 400° C.

In the aforesaid process, in the case of a luminescent layer composed of an element of Group II and an element of Group VI, to which a luminescent center element is added, being formed by use of the sputtering method or evaporation method, there is used a source material composed of a compound of an element of Group II and an element of Group VI, to which a halide of a rare earth element is added, and into the atmosphere, there is introduced at least one kind of gas selected from chlorine ($Cl_2$) gas, hydrogen chloride (HCl) gas, vaporized chlorine compounds, hydrogen bromide (HBr) gas and hydrogen iodide (HI) gas, whereby the halogen element (Cl, Br, I) is replaced with the element of Group VI. Consequently, one of the elements of Group II which exists at the nearest neighbor site of the replaced halogen element goes out of the lattice owing to the self-compensation effect of the charge, so that a vacancy of the element of Group II is formed. As a result, the luminescent center element is easily replaced with the element of Group II, and even when there is used as a luminescent center element a rare earth element which has been difficult to replace with an element of Group II, efficient replacement of the rare earth element with the element of Group II becomes possible, so that the crystallinity of the luminescent layer is improved. In addition, according to this process, even when there is used only one source material composed of a compound of an element of Group II and an element of Group VI, to which a halide of a rare earth element is added, the crystallinity of the luminescent layer can be noticeably improved.

Consequently, there is markedly improved the crystallinity of the luminescent layer composed of a compound of an element of Group II and an element of Group VI, to which a luminescent center element is added. As a result, the carrier becomes able to be easily accelerated owing to the electric field in the luminescent layer, and the probability of a non-luminescent transition process is also reduced. In addition, according to this process, since there is used a single source, i.e., a compound of an element of Group II and an element of Group VI, to which a halide of a rare earth element is added, and into the atmosphere, there is introduced at least one kind of gas selected from the group consisting of chlorine gas ($Cl_2$), hydrogen chloride (HCl) gas, vaporized chlorine compounds, hydrogen bromide (HBr) gas, and hydrogen iodide (HI) gas, there can be simply formed a luminescent layer without using two sources as required in the conventional process. As a result, an EL element obtained by this process becomes noticeably increased in luminance, even if it is an element of a luminescence color for which sufficient luminance has never been obtained.

In the process according to the second aspect of the present invention, the compound of an element of Group II and an element of Group VI is preferably selected from zinc sulfide, zinc selenide and strontium sulfide, and the aforesaid luminescent center element is preferably selected from the group of rare earth elements.

Preferably, the aforesaid halide is a chloride or bromide.

The aforesaid rare earth element is preferably selected from samarium, thulium, and terbium.

It is preferable that the aforesaid compound of an element of Group II and an element of Group VI should be zinc sulfide, that the fluoride or fluorine compound of the aforesaid luminescent center element should be samarium trifluoride or terbium oxyfluoride, and that the halide other than fluoride of the aforesaid element of Group II should be hydrogen chloride.

In this process, in the case of a luminescent layer composed of a compound of an element of Group II and an element of Group VI, to which a luminescent center element is added, being formed by the sputtering method or evaporation method, there is used as the source material of a sputtering target or evaporation material, which is composed of a compound of an element of Group II and an element of Group VI as a host material, and which contains a fluoride of the luminescent center element or a fluorine compound as an additive and also contains a chloride, bromide or the like of the element of Group II of the host material. As a result, during the film formation of the luminescent layer, chlorine (Cl), bromine (Br) or the like among the halogen elements contained in the sputtering target or evaporation material is replaced with the element of Group VI. Consequently, one of the elements of Group II which exists at the nearest neighbor site of the replaced halogen element, goes out of the lattice owing to the self-compensation of the charge, so that a vacancy for the element of Group II is produced. Then, the rare earth element of the luminescent center comes easily into the vacancy, resulting in replacement of the rare earth element with the element of Group II. In consequence, even when there is used as a luminescent center element a rare earth element which has hitherto been difficult to replace with an element of Group II, it becomes possible to efficiently replace the rare earth element with an element of Group II according to the present process. As a result, there is a noticeable improvement in the crystallinity of the luminescent layer composed of a compound of an element of Group II and an element of Group VI, to which the luminescent center element is added. Consequently, it becomes easy to accelerate the carrier in the luminescent layer owing to the electric field, and the probability of a non-luminescent transition process is reduced, whereby the probability of contributing to luminescence is increased, resulting in improvement of the luminance. Accordingly, an EL element obtained by the present process is noticeably increased in luminance even for the element of each luminescence color for which sufficient luminance has never been obtained from the practical point of view.

In the process according to the third aspect of the present invention, the aforesaid pretreatment is performed preferably by electric discharge in the film formation atmosphere while a chlorine-containing gas is introduced in said film formation atmosphere. After the completion of the aforesaid pretreatment, in the case of the aforesaid luminescent layer being formed as a film onto the aforesaid insulating substrate by the sputtering method by use of the aforesaid source material, the film formation atmosphere is brought to preferably an inactive gas atmosphere.

The aforesaid insulating substrate is disposed in the film formation atmosphere preferably after the completion of the aforesaid pretreatment step, and the aforesaid pretreatment may be carried out once or more per 6 times of film formation of the aforesaid luminescent layer.

Preferably, the aforesaid host material is zinc sulfide. In addition, the aforesaid fluoride of the luminescent center element is selected preferably from samarium fluoride, terbium oxyfluoride, and manganese fluoride, and the aforesaid chlorine-containing gas is selected preferably from hydrogen chloride, chlorine, and carbon tetrachloride.

In addition, in the EL element of the present invention, the aforesaid fluoride of the luminescent center element is selected preferably from samarium fluoride, terbium oxyfluoride, and manganese fluoride.

In the EL elements of the present invention, as good products are ones having the characteristics that the X-ray diffraction spectrum exhibits only a single peak at an X-ray diffraction angle ranging from 25° to 30°. In addition, the angle of incidence of X-ray for the aforesaid insulating substrate and the aforesaid luminescent layer is preferably set within the range between 1° and 10°.

Figure 13:
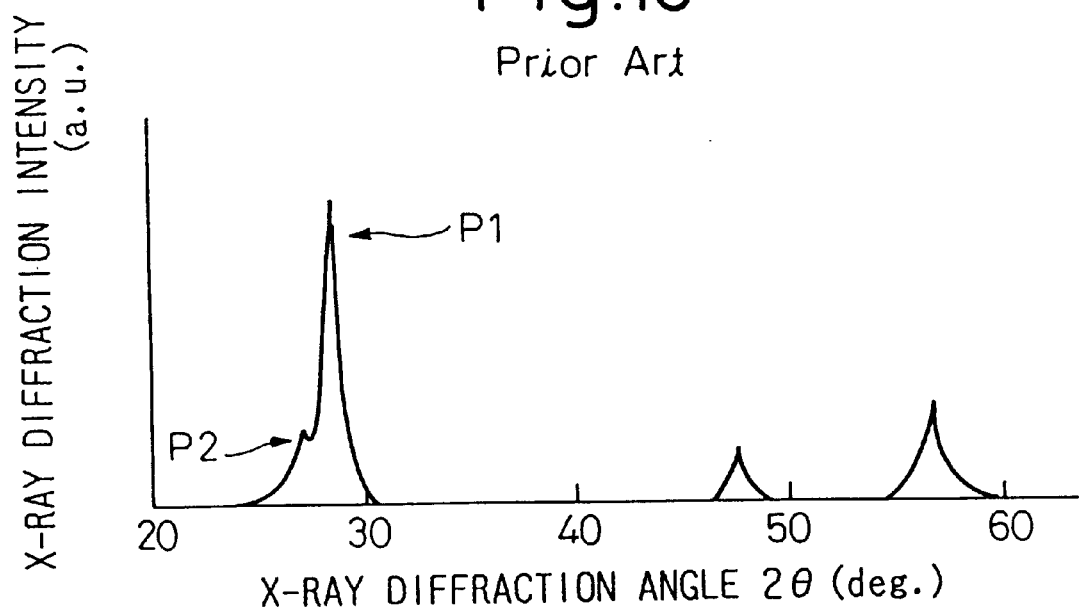
FIG. 13 is a thin film X-ray diffraction spectrum pattern of a luminescent layer thin film according to the conventional process, which has not been subjected to the pretreatment according to the present invention.
Figure 14:
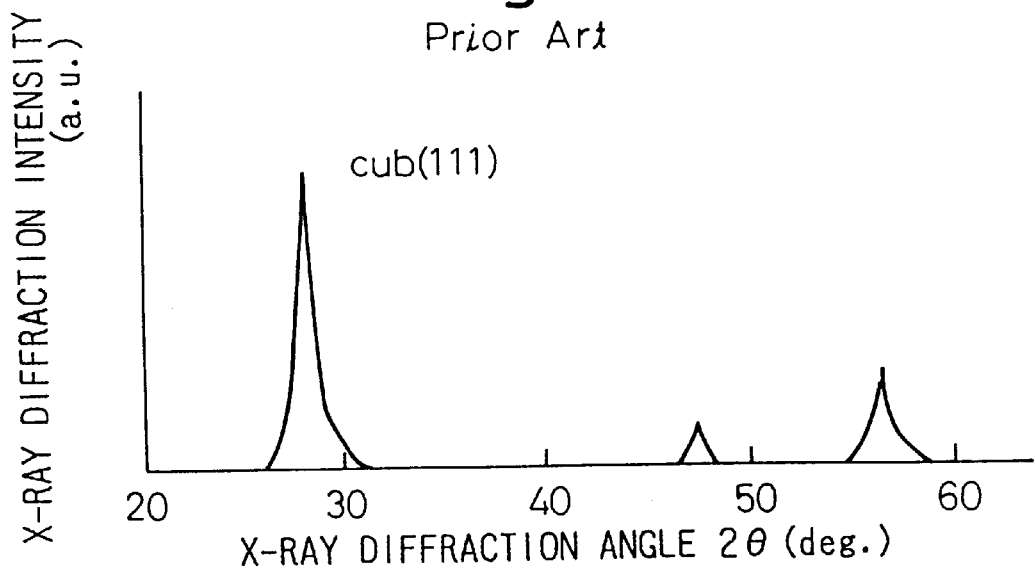
FIG. 14 is an ordinary X-ray diffraction spectrum pattern of a luminescent layer thin film according to the conventional process, which has not been subjected to the pretreatment according to the present invention.

The present inventors measured an EL element prepared by the sputtering method according to the conventional process, by use of a thin film X-ray diffraction method, wherein the angle of incidence ($\alpha$) is small, instead of the ordinary X-ray diffraction method, so as to obtain relevant results. The thus obtained results are illustrated in FIG. 13. That is, in FIG. 13, although there was used the same sample as used in the sample evaluated by the ordinary X-ray diffraction method (FIG. 14), a new X-ray diffraction peak (another peak) was detected in the proximity of an X-ray diffraction angle of 27°. Since the other peak indicates the presence of a crystal structure other than a cubic structure or the presence of another substance, it was found that the EL element prepared by the conventional process has a crystal structure wherein a cubic structure and a crystal structure other than a cubic structure are mixed. On the basis of this finding, the present inventors came up with an idea of introducing an HCl gas in a process for the production of an EL element by the sputtering method, and thus arrived at the process according to the third aspect of the present invention.

In addition, the present inventors have confirmed that, among the EL elements produced by the present process, an element of such a structure as mentioned in the following can noticeably improve the luminance. That is, it has become clear that the luminance can be improved by an EL element formed by laminating on an insulating substrate a first electrode, first insulating layer, luminescent layer, second insulating layer, and second electrode in the named order, making at least the material at the light-deriving side optically transparent, characterized in that the aforesaid luminescent layer is composed of zinc sulfide (ZnS) as a host material and a fluoride of a luminescent center element ($SmF_3$, TbOF, $MnF_2$) as a luminescent center material, and that the X-ray diffraction spectrum of said luminescent layer has only a single peak at an X-ray diffraction angle ranging from 25° to 30° (no other peaks exist at an X-ray diffraction angle of about 27°) according to a thin film X-ray diffraction method using Cu-Kd radiation, one of the available X-ray sources.

In addition, the present inventors have found that, on the contrary, in order to evaluate and select good products with high luminance, the ordinary X-ray diffraction method is insufficient, and a thin film X-ray diffraction method, wherein the angle of incidence ($\alpha$) of X-ray is small, is effective. That is, when evaluating such EL elements of the present invention as mentioned above, good products are judged as those with high luminance of EL elements with an X-ray diffraction spectrum with has only one peak at an X-ray diffraction angle ranging from 25° to 30° according to a thin film X-ray diffraction method using Cu-Kd radiation.

That is, the present inventors were the first ones to find that when an EL element produced by the sputtering method according to the conventional process is analyzed by use of a thin film X-ray diffraction method, the luminescent layer thereof assumes a structure wherein a cubic structure and a crystal structure other than the cubic structure are mixed. In addition, the present inventors made it clear that in an EL element with high luminance, the X-ray diffraction spectrum has only one peak at an X-ray diffraction angle ranging from 25° to 30° according to a thin film X-ray diffraction method using Cu-Kd radiation, and by utilization of this fact, the present inventors were able to realize an EL element with high luminance and a process for the production of such an EL element. In addition, the present inventors were able to realize an EL element with high luminance, by the means such that, in an EL element comprising zinc sulfide as a host material and a luminescent layer with a fluoride of a luminescent center element added, as a luminescent center, the luminescent layer is pretreated with an HCl gas introduced previously to the formation of the luminescent layer as a film.

In the following, the present invention will be explained with reference to concrete embodiments.

Process According to the First Aspect of the Present Invention

FIG. 1 is a typical cross-sectional view of a thin film EL element 100 obtained by the process of the present invention. In the EL element 100, light is taken out in the direction of the arrow marks. The EL element 100 is constituted such that on a glass substrate 11, i.e. an insulating substrate, there are laminated the following thin films in the named order. On the glass substrate 11, there is formed a first transparent electrode (first electrode) 12 composed of optically transparent zinc oxide (ZnO), on the top of which there are formed a first insulating layer 13 composed of optically transparent tantalum pentaoxide ($Ta_2O_5$), and a luminescent layer 14 composed of zinc sulfide with samarium added as a luminescent center, having a characteristic feature of the present invention, a second insulating layer 15 composed of optically transparent tantalum pentaoxide ($Ta_2O_5$), and a second transparent electrode (second electrode) 16 composed of optically transparent zinc oxide (ZnO).

In the following, there will be mentioned a process for the production of the aforesaid thin film EL element. First, on the glass substrate 11, there is formed the first transparent electrode 12 as a film. As a deposition material, there is used a product obtained by adding gallium oxide ($Ga_2O_3$) to zinc oxide (ZnO) powder for mixing, and molding the mixture into a pellet, and as a film formation device, there is used an ion plating device. Specifically, the interior of the ion plating device is exhausted to a vacuum state while the temperature of the aforesaid glass substrate is maintained constant, following which an argon gas is introduced into the ion plating device so as to maintain the pressure thereof constant, and the beam power and radio frequency power are adjusted such that the growth rate is within the range of between 6 and 18 nm/min.

Subsequently, on the aforesaid first transparent electrode 12, there is formed the aforesaid first insulating layer 13 by the hitherto known sputtering method. Concretely, a gas mixture of argon (Ar) and oxygen ($O_2$) is introduced into the sputtering device while the temperature of the aforesaid glass substrate 11 is maintained constant, and film formation is carried out by use of a radio frequency power of 1 KW.

On the aforesaid first insulating layer 13, there is formed by the sputtering method the zinc sulfide: samarium (ZnS:Sm) luminescent layer 14 comprising zinc sulfide (ZnS) as a host material with samarium added as a luminescent center. Concretely, the interior of the film growth chamber is brought to a reduced pressure atmosphere, while the aforesaid glass substrate 11 is maintained at a constant temperature of 250° C., following which a 99:1 gas mixture of argon (Ar) and hydrogen chloride (HCl) is introduced into the film growth chamber such that the pressure of the chamber becomes 0.6 Pa. Subsequently, the vacuum exhaustion system is adjusted such that the pressure of the interior of the film growth chamber becomes 4.0 Pa. Subsequently, the luminescent layer 14 is formed as a film at a radio frequency power of 150 W and a deposition rate of 25 nm/min. As the sputtering target (source material), there is used zinc sulfide (ZnS) with samarium trifluoride ($SmF_3$) added as a luminescent center material.

Subsequently, on the aforesaid luminescent layer 14, there is formed the second insulating layer 15 composed of tantalum pentaoxide ($Ta_2O_5$), in the same way as in the case of the aforesaid first insulating layer 13 being formed. Subsequently, the second transparent electrode 16 composed of a zinc oxide (ZnO) film is formed on the second insulating layer 15 in the same way as in the case of the aforesaid first transparent electrode 12 being formed. In this embodiment, the film thicknesses of the layers are as follows: 300 nm for the first transparent electrode 12 and the second transparent electrode 16; 400 nm for the first insulating layer 13 and the second insulating layer 15; and 600 nm for the luminescent layer. The thicknesses of these layers are those at the central portions thereof, respectively.

Figure 2A:
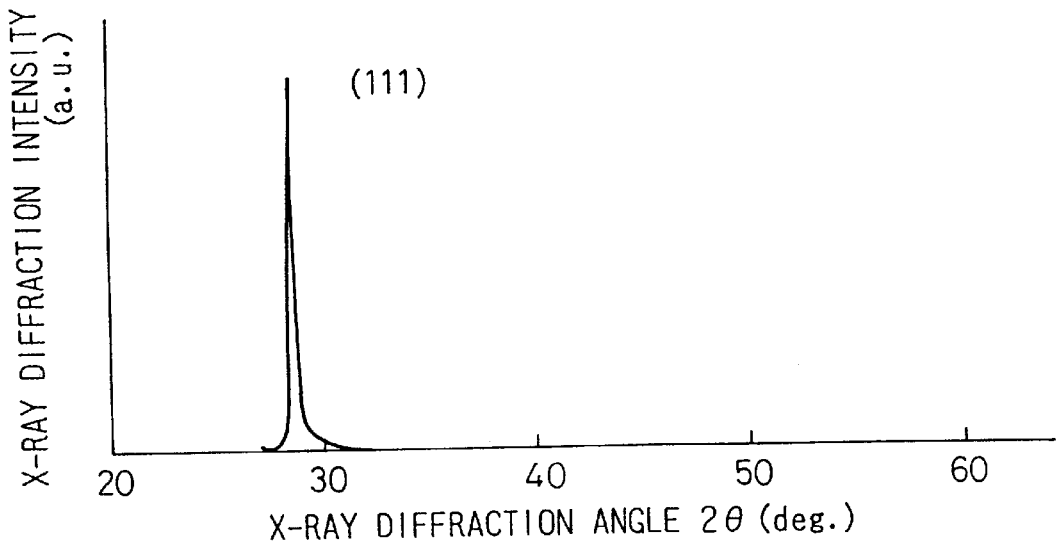
FIGS. 2A and 2B are characteristic diagrams illustrating the X-ray diffraction spectrum of a luminescent layer thin film of an EL element obtained according to an embodiment of the process of the present invention.
Figure 2B:
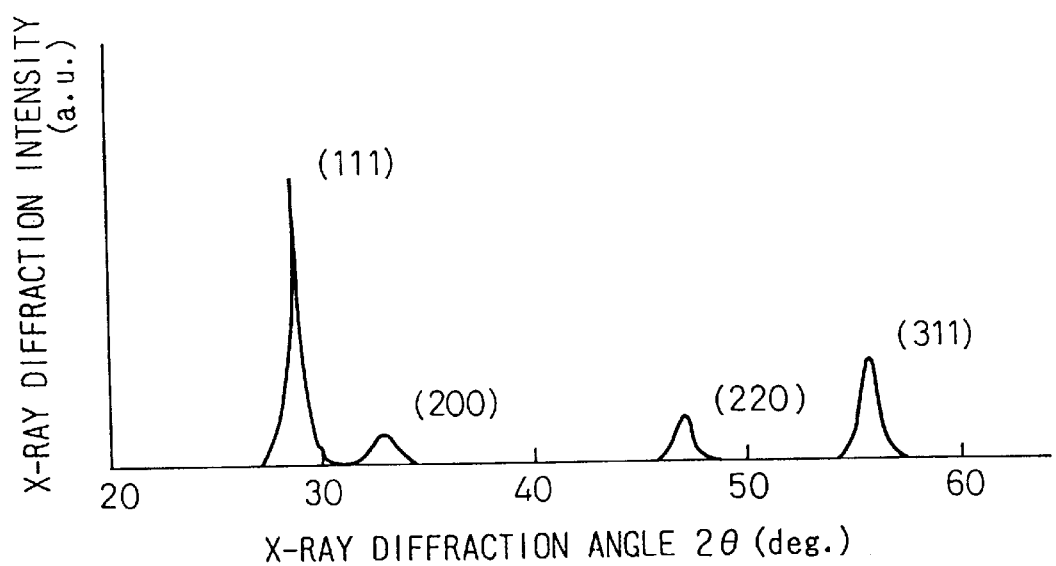

The X-ray diffraction spectra of the luminescent layers 14 of actually prepared samples are illustrated in FIGS. 2A and 2B, respectively. The sample used as a control in FIG. 2B is a conventional type one prepared in the same way as in the aforesaid embodiment with the exception that a hydrogen chloride (HCl) gas is not introduced into the film growth chamber. As illustrated in FIG. 2A, in the sample prepared according to the present embodiment, peaks other than (111) are too small to be observed, the relative intensity of the (111) diffraction peak is increased as compared with the control, and the (111) orientatability is noticeably improved. This phenomenon shows that, by the effect of the present invention, samarium (Sm) is efficiently replaced with zinc (Zn) site, whereby the crystallinity of the zinc sulfide (ZnS) luminescent layer 14 is markedly improved.

Figure 3:
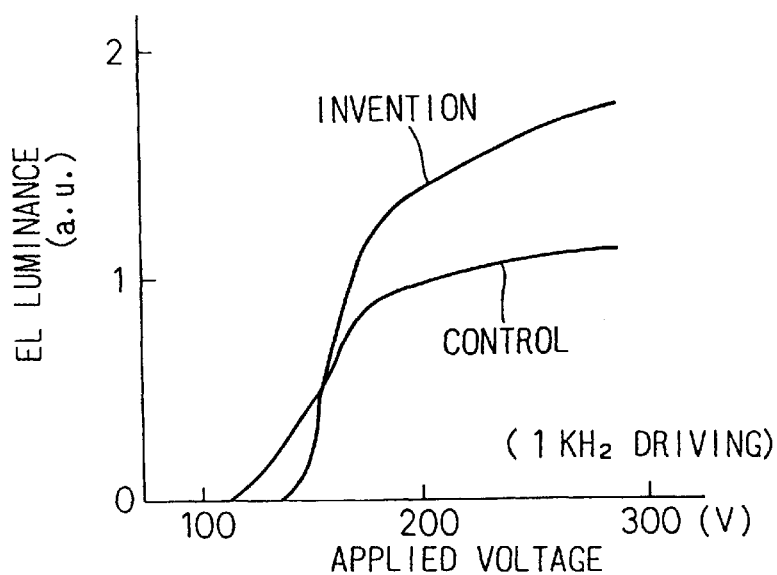
FIG. 3 is a characteristic diagram illustrating the luminance of the EL element obtained according to the aforesaid embodiment for applied voltages.

Next, the voltage-luminance curves for the aforesaid samples are illustrated in FIG. 3. As illustrated in FIG. 3, it can be seen that, in the sample prepared according to the present embodiment, the maximum luminance is improved to a value about 2 times as much as that of the aforesaid control sample, and the leading edge characteristic becomes abrupt, showing a more desirable characteristic.

In order to obtain such an effect of the present invention as mentioned above, it is necessary to set the amount of the hydrogen chloride (HCl) gas to be introduced within a specific range. According to the present inventors' experiment, it has been found that, if the partial pressure ratio of the hydrogen chloride gas to the atmosphere at the time of growth the aforesaid luminescent layer 14 as a film is set approximately within the range between 0.001 and 0.02, the effect of the present invention can be obtained. Especially when the partial pressure ratio of the hydrogen chloride (HCl) gas to be introduced is set too much greater than 0.02, the luminescent layer 14 composed of zinc sulfide (ZnS) is etched, resulting in lowering of the crystallinity, roughness of the surface or the like, so that the luminance becomes rather lowered. On the contrary, when this partial pressure ratio is set to a value less than 0.001, no effect can be obtained.

Figure 4:
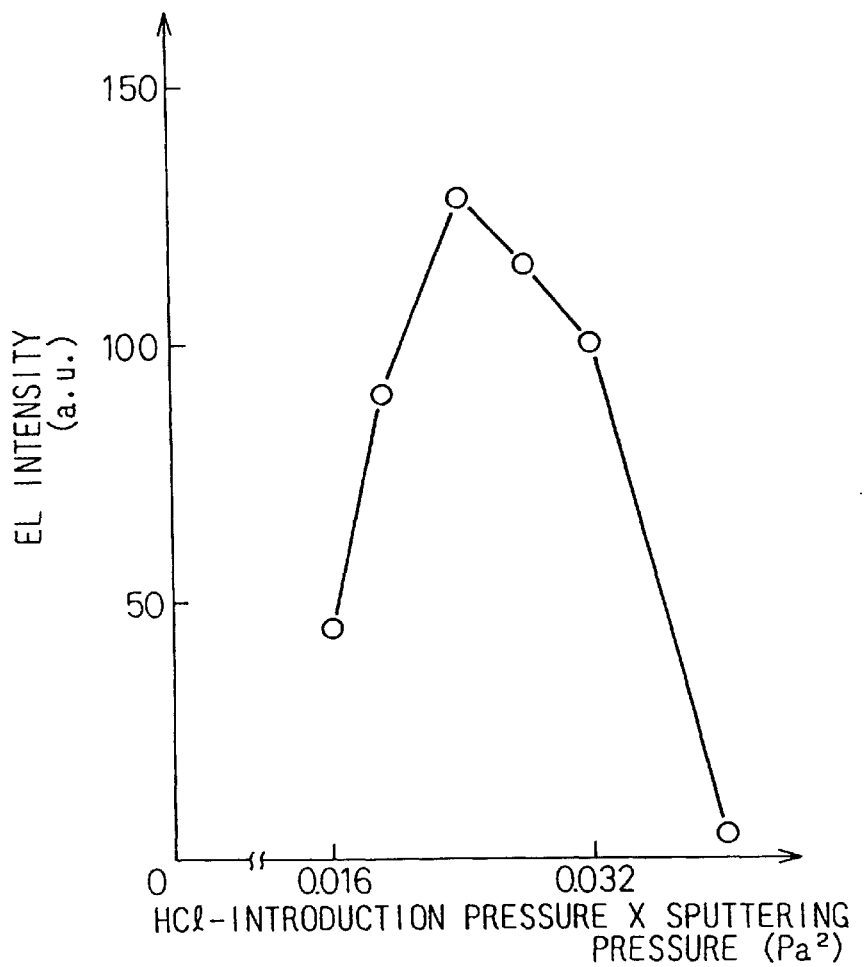
FIG. 4 is a graph illustrating the change in the EL intensity with the product of HCl gas introduction partial pressure and sputtering pressure in the process of the aforesaid embodiment.

In addition, more specifically, the effect of the present invention depends also upon the pressure of the film growth chamber at the time of sputtering. As illustrated in FIG. 4, letting the introduction partial pressure of the hydrogen chloride (HCl) gas be "a" and the pressure at the time of sputtering be "b", the effect of improving the luminance was noticeable especially when the product value of "a" and "b" was within the range between 0.016 ($Pa^2$) and 0.035 ($Pa^2$).

Such an effect of noticeable improvement of the crystallinity of the luminescent layer 14 as mentioned above is obtained not only in the case of the aforesaid embodiment, but a similar effect can be obtained also when there is used as a luminescent center element another rare earth element such as thulium (Tm) and terbium (Tb). In addition, although zinc sulfide is used as the host material of the luminescent layer in the present embodiment, it is needless to say that even when a compound of an element of Group II and an element of Group VI is used as the host material, the principle of the present invention can be similarly applied and the effect is still the same. As mentioned above, by use of the present invention, an EL element with higher luminance as compared with the luminance of the element obtained by the conventional process has been able to be obtained by a simpler process.

Process According to the Second Aspect of the Present Invention

In the completely same way as the aforesaid first process, there are formed the first transparent electrode (first electrode) and first insulating layer 13 of the EL element 100 illustrated in FIG. 1. Subsequently, on the thus formed first insulating layer 13, there is formed by the sputtering method the zinc sulfide:samarium (ZnS:Sm) luminescent layer 14 comprising zinc sulfide (ZnS) as a host material with samarium added as a luminescent center material. Concretely, the interior of the film growth chamber is brought to a reduced pressure atmosphere while the aforesaid glass substrate 11 is maintained at a constant temperature, following which a gas mixture of argon (Ar) and helium (He) is introduced into the film growth chamber, and the luminescent layer 14 is formed at a radio frequency power of 150 W and deposition rate of 250 nm/min. As the sputtering target, zinc sulfide (ZnS) is used with samarium trifluoride ($SmF_3$) added as luminescent center materials and zinc chloride ($ZnCl_2$).

In addition, still in the same way as the aforesaid first process, there were formed on this luminescent layer 14 the second insulating layer 15 and the second transparent electrode 16. The film thicknesses of the layers in the present embodiment are as follows: 300 nm for the first transparent electrode 12 and the second transparent electrode 16; 400 nm for the first insulating layer 13 and the second insulating layer 15; and 600 nm for the luminescent layer. The thicknesses of theses layers are those at the central portions thereof, respectively.

Figure 5A:
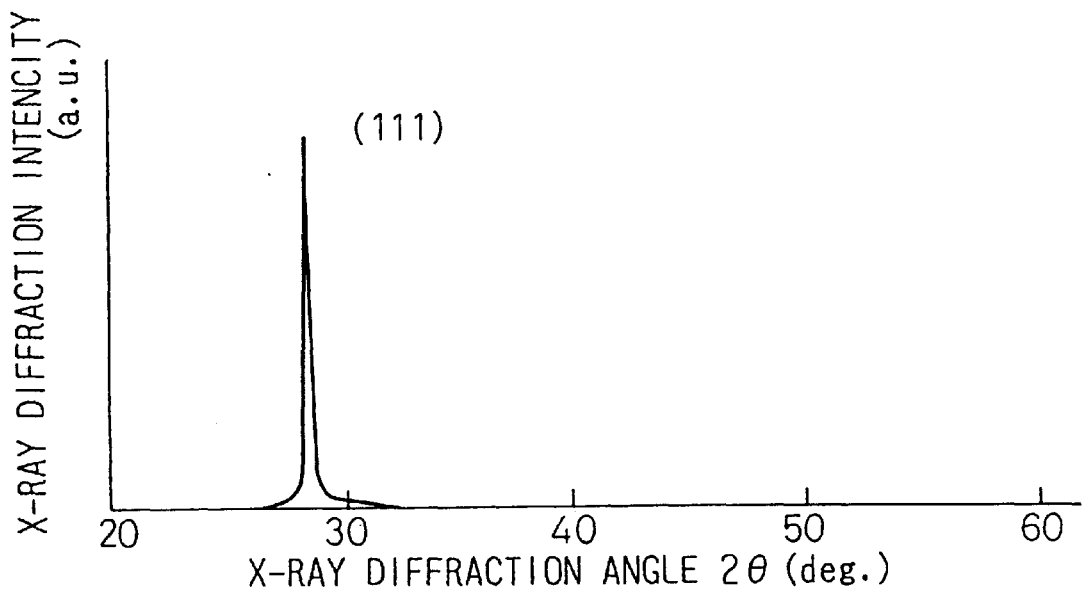
FIGS. 5A and 5B are characteristic diagrams of the X-ray diffraction diagram of a luminescent layer thin film of an EL element obtained according to another embodiment of the process of the present invention.
Figure 5B:
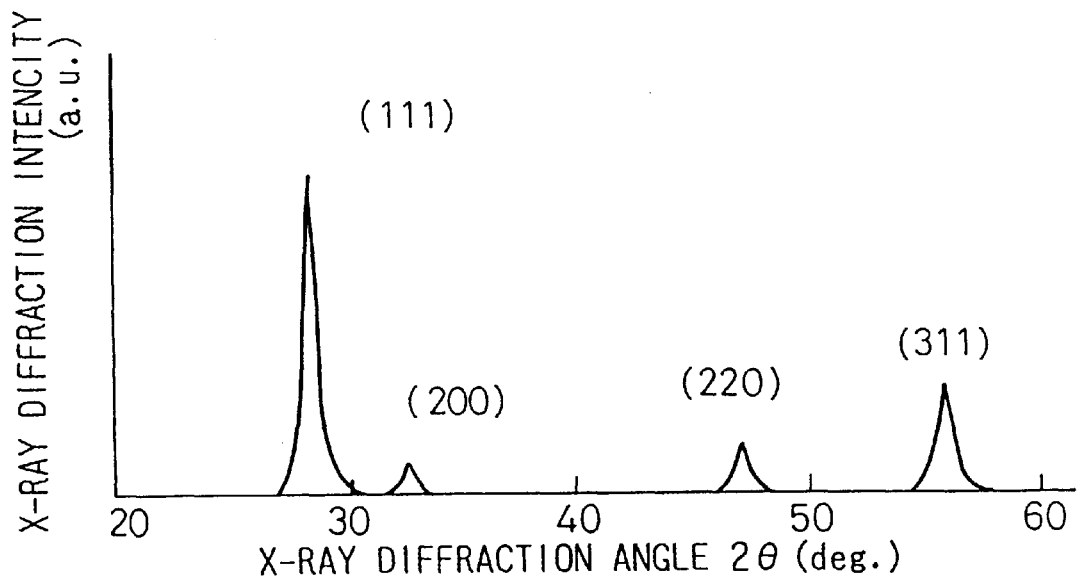
Figure 6:
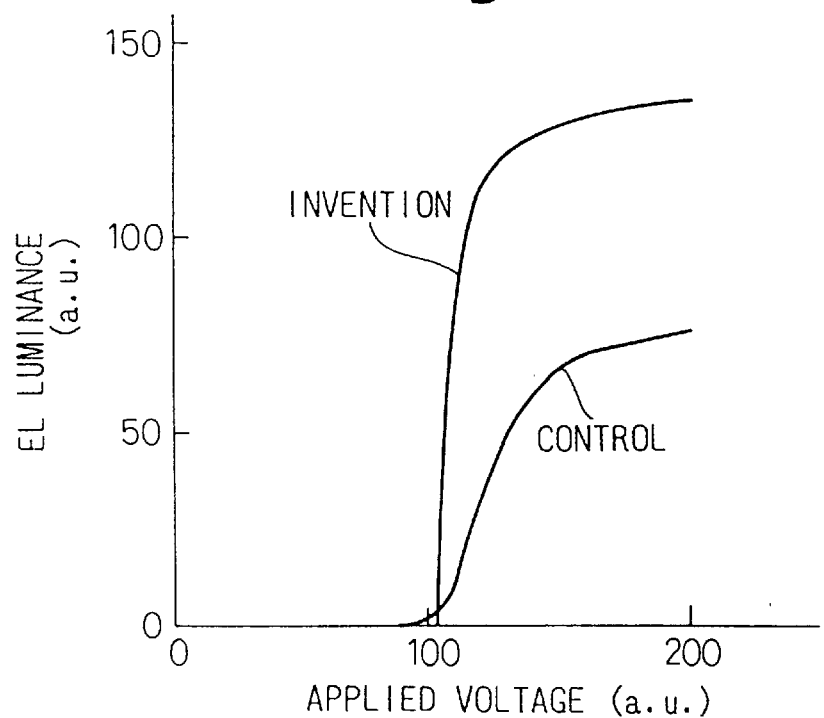
FIG. 6 is a characteristic diagram illustrating luminance for applied voltages for the EL element obtained according to the aforesaid another embodiment.
Figure 7:
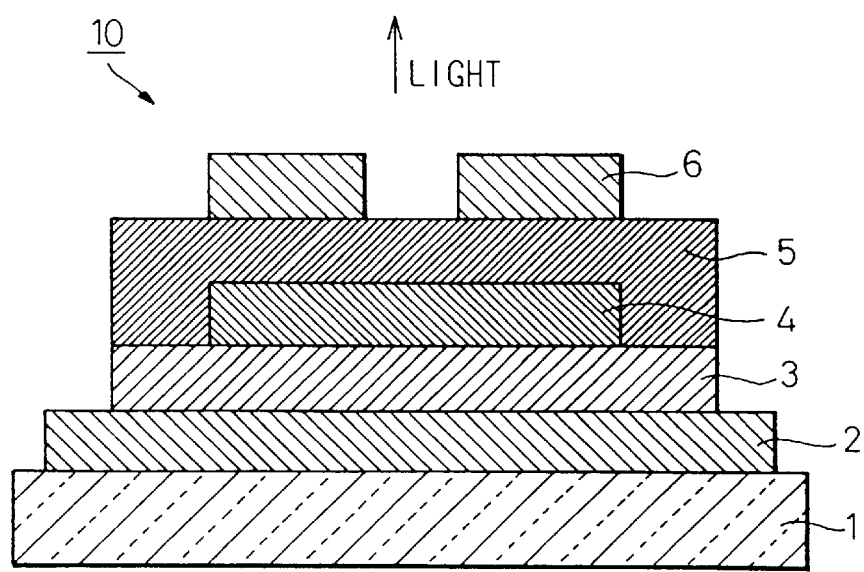
FIG. 7 is a typical cross-sectional view of the conventional EL element.

The X-ray diffraction spectra of the luminescent layers 14 of actually prepared samples are illustrated in FIGS. 5A and 5B, respectively. The sample used as a control in FIG. 5B is a sample prepared in the same way as in the aforesaid embodiment with the exception that a sputtering target containing no zinc chloride ($ZnCl_2$) is used. As illustrated in FIG. 5A, in the sample prepared according to the present embodiment, the relative intensity of the (111) peak is increased as compared with the control (5B) to such an extent that signals other than the (111) plane cannot be recognized, and the (111) orientability is noticeably improved. This shows that, by the effect of the present invention, samarium (Sm) is efficiently replaced at the site of zinc (Zn) used as a host material, whereby the crystallinity of the zinc sulfide (ZnS) luminescent layer 14 is markedly improved. In addition, the voltage-luminance curves for these actually prepared samples are illustrated in FIG. 6. As illustrated in FIG. 6, it can be seen that, in the sample prepared according to the present invention, the maximum luminescence brightness is improved to a value about 2 times as much as that of the control sample, and the leading edge characteristic becomes abrupt. As mentioned in the foregoing, by use of the present invention, there can be realized an EL element with higher luminance as compared with that of an EL element prepared by the conventional process.

Such an effect of noticeable improvement of the crystallinity of the luminescent layer 14 as mentioned above is obtained not only in the case of the samarium trifluoride used as a luminescent center material in the aforesaid embodiment, but a similar effect can be obtained also when there is used a fluoride of a rare earth element known as a luminescent center material, i.e. samarium oxyfluoride (SmOF), thulium trifluoride ($TmF_3$) or thulium oxyfluoride (TmOF). In addition, it has been confirmed that, by applying the process of the present invention to the production process for an EL element using as a luminescent center material terbium trifluoride ($TbF_3$) or terbium oxyfluoride (TbOF), for which comparatively high luminance has hitherto been obtained, the crystallinity of the luminescent layer 14 can be similarly improved and the EL luminance is noticeably improved as compared with an EL element produced by the conventional process.

In addition, although there are mentioned as rare earth elements samarium, thulium, and terbium in the present embodiment, the present invention can provide the same effect also with respect to other rare earth elements used as a luminescent center material. In addition, although zinc sulfide is used as the host material of the luminescent layer in the present embodiment, it is needless to say that even when any of all the other compounds of an element of Group II and an element of Group VI is used as the host material, the principle of the present invention can be similarly applied, and the effect is still the same not only in EL elements of the conventional type but also any other type EL elements, so long as it has a structure such that a luminescent layer is sandwiched between electrodes.

Process According to the Third Aspect of the Present Invention and EL Element Obtained Thereby In the following, there will be explained an example of the operation for producing an EL element with the same structure as that of the EL element illustrated in FIG. 1.

(a) First, the first transparent electrode 12 was formed as a film onto the glass substrate 11. Specifically, as the deposition material, there was used a product obtained by adding gallium oxide ($Ga_2O_3$) to zinc oxide (ZnO) powder for mixing and molding the mixture into a pellet form, and as a film formation device an ion plating device was used. Subsequently, the interior of the ion plating device was exhausted to a vacuum state while the glass substrate was maintained at a constant temperature. Thereafter, argon gas was introduced into the ion plating device, so as to maintain the device at a constant pressure, and the beam power and radio frequency power were adjusted.

(b) Next, on the first transparent electrode 12, there was formed by sputtering the first insulating layer 13 composed of tantalum pentaoxide ($Ta_2O_5$). Concretely, the interior of the sputtering device was exhausted to a vacuum state while the glass substrate was maintained at a constant temperature. Subsequently, a gas mixture of argon (Ar) and oxygen ($O_2$) was introduced into the sputtering device so as to maintain the device at a constant pressure, and the radio frequency power was adjusted, so that the first insulating layer 13 was formed.

Figure 8:
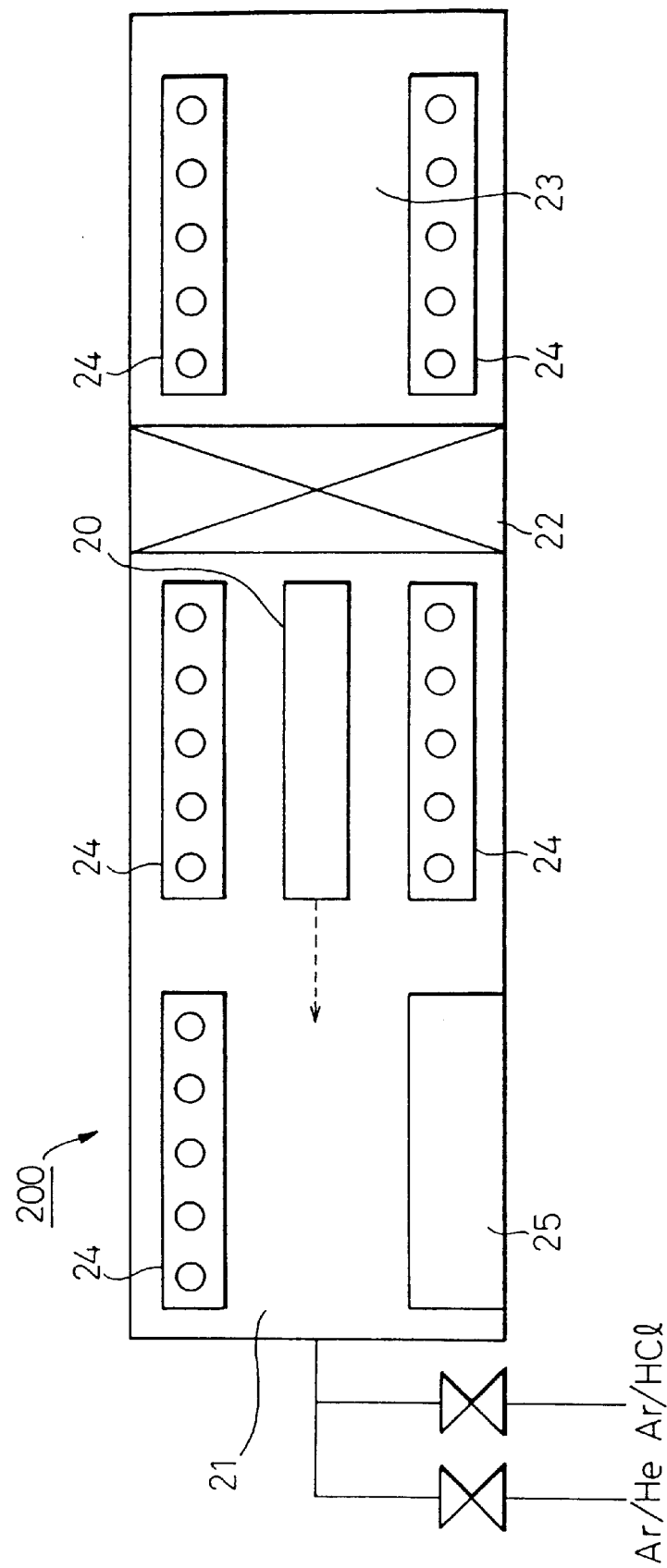
FIG. 8 is a typical view illustrating the structure of a substrate conveyance type sputtering device, one of the specific devices for obtaining the structure of the luminescent layer of the present invention.

FIG. 8 is a view of a substrate conveyance system sputtering device seen from the top thereof and is also an explanatory view illustrating a structure of a specific device for obtaining the luminescent layer of the present invention. The film growth chamber 21 has a structure such that an argon (Ar) gas and hydrogen chloride (HCl) gas can be introduced thereinto, and on the lateral side in the film growth chamber 21, there are provided a plurality of heaters 24 in the vertical direction. In addition, on a part of the lateral side in the film growth chamber 21, there is provided a target 25 for sputtering. A substrate 20 is supported in the vertical direction to a not shown conveyance base and conveyed in the direction of the arrow mark into the film growth chamber from the side of a substrate-heating chamber 23, and, in the course of the conveyance, the substrate is heated to a determined temperature and this temperature is maintained by a heater 24, and a luminescent layer is formed by the sputtering method. The target 25 is composed of zinc sulfide:samarium trifluoride ($ZnS:SmF_3$), and comprises zinc sulfide (ZnS) as a host material, identical with the material of the luminescent layer, to which there is added samarium trifluoride as a luminescent center. In addition, a gate valve 22 is provided between the film growth chamber 21 and the substrate-heating chamber 23, and cuts off these chambers in a closed state of the valve as a partition, and at an open state of the valve 22, the substrate 20 can be conveyed from the substrate-heating chamber 23 to the film growth chamber 21. In addition, the film growth chamber 21 and the substrate-heating chamber 23 are connected to a not shown vacuum pump.

(c) In this substrate conveyance system sputtering device, first, there was carried into the substrate-heating chamber 23 the glass substrate 11 with the first insulating layer formed thereon, and the substrate 20 was maintained at a constant temperature, and subsequently, the gate valve 22 was brought to an open state, following which the substrate 20 was carried into the film growth chamber 21 (at the position of the substrate 20 in FIG. 8).

(d) Subsequently, into the film growth chamber 21 with the target 25 fitted, there was introduced HCl, i.e. a chlorine (Cl)-containing gas so as to perform discharge, whereby there was carried out a pretreatment constituting one of the characteristic features of the present invention. Specifically, a 10% hydrogen chloride (HCl) gas diluted with argon (Ar) was introduced into the film growth chamber, so as to maintain the interior of the film growth chamber 21 at a pressure of 4 Pa, whereupon discharge was conducted for 60 minutes by a radio frequency power of 2 $W/cm^2$ so as to perform the pretreatment.

(e) Subsequently, the introduced gas was changed over to a gas mixture of argon (Ar) and helium (He), and the interior of the film formation chamber was maintained at a pressure of 4 Pa, following which discharge was conducted at a radio frequency power of 2 $W/cm^2$, conveying of the substrate was commenced, so as to make the substrate shuttle in front of the target, whereby a film was uniformly grown on the substrate. In such a way as mentioned above, on the first insulating layer 13 of the aforesaid substrate, there can be formed as a film the luminescent layer 14 composed of zinc sulfide:samarium trifluoride ($ZnS:SmF_3$), the layer comprising zinc sulfide (ZnS) as a host material, with samarium trifluoride added as a luminescent center, by the sputtering method. Although, in the aforesaid example of production, the film growth was carried out in the state such that the substrate 20 was conveyed into the film growth chamber during the pretreatment, it is not necessary for the substrate 20 to be present in the film growth chamber 21 during the pretreatment, and the substrate 20 may be on the outside of the device of FIG. 8.

Figure 9:
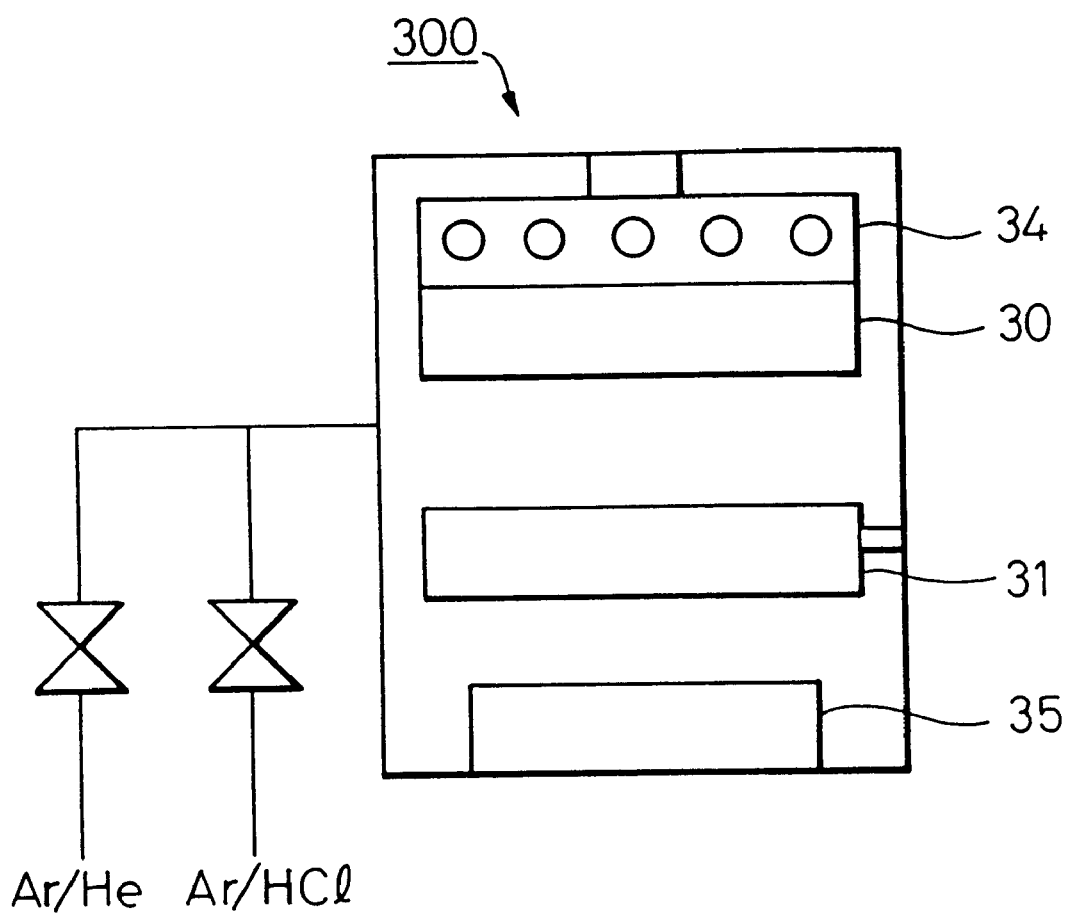
FIG. 9 is a typical view illustrating the structure of a batch system sputtering device, one of the specific devices for obtaining the structure of the luminescent layer of the present invention.
Figure 11A:
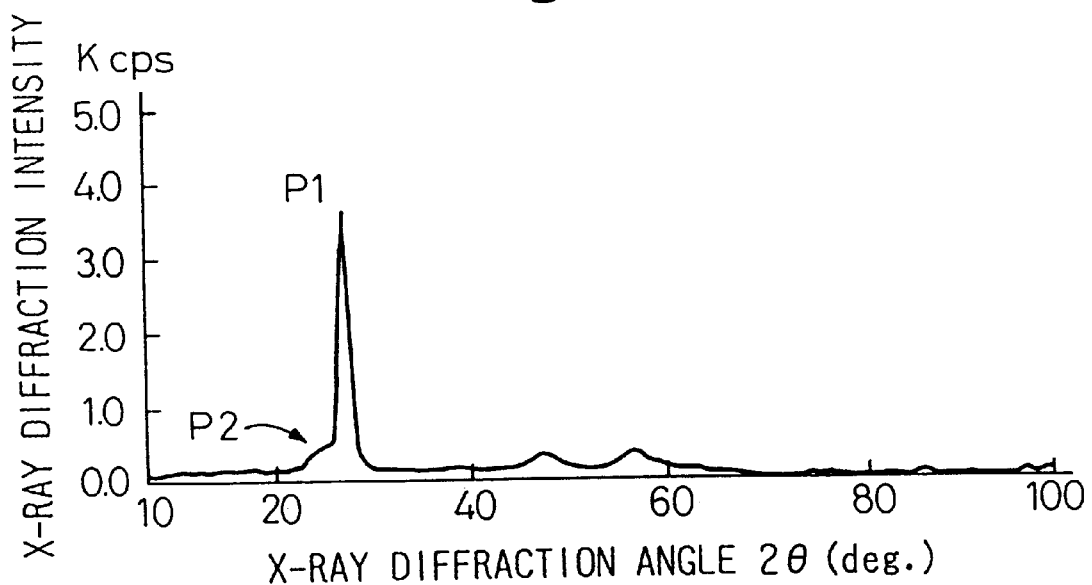
FIGS. 11A; 11B, 11C, and 11D are, respectively, an X-ray diffraction spectrum pattern of a luminescent layer thin film when the angle of incidence of X-ray is made to vary within the range between 1° to 10°.
Figure 11B:
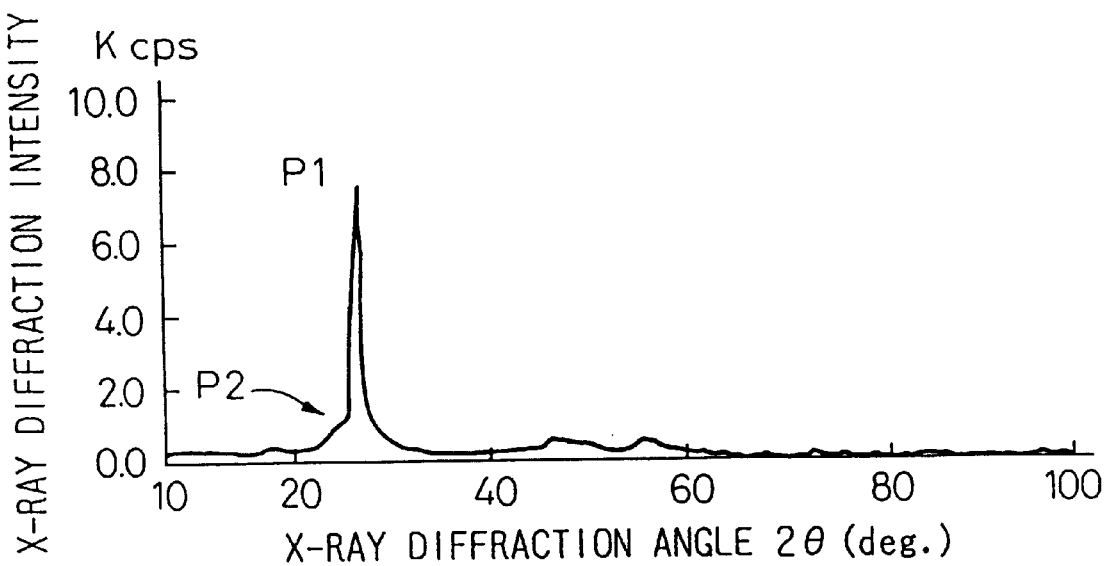
Figure 11C:
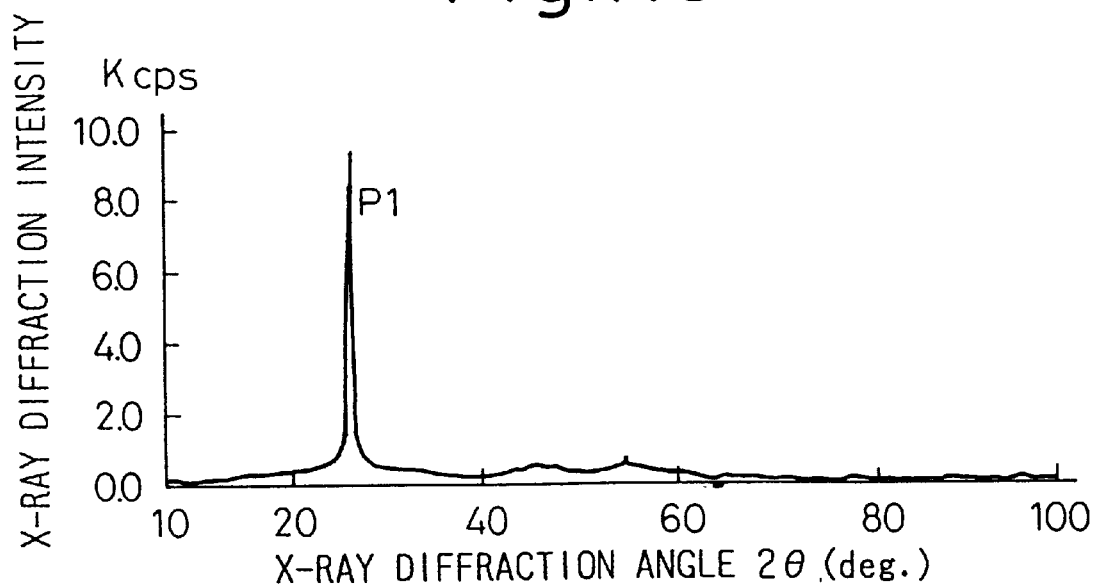
Figure 11D:
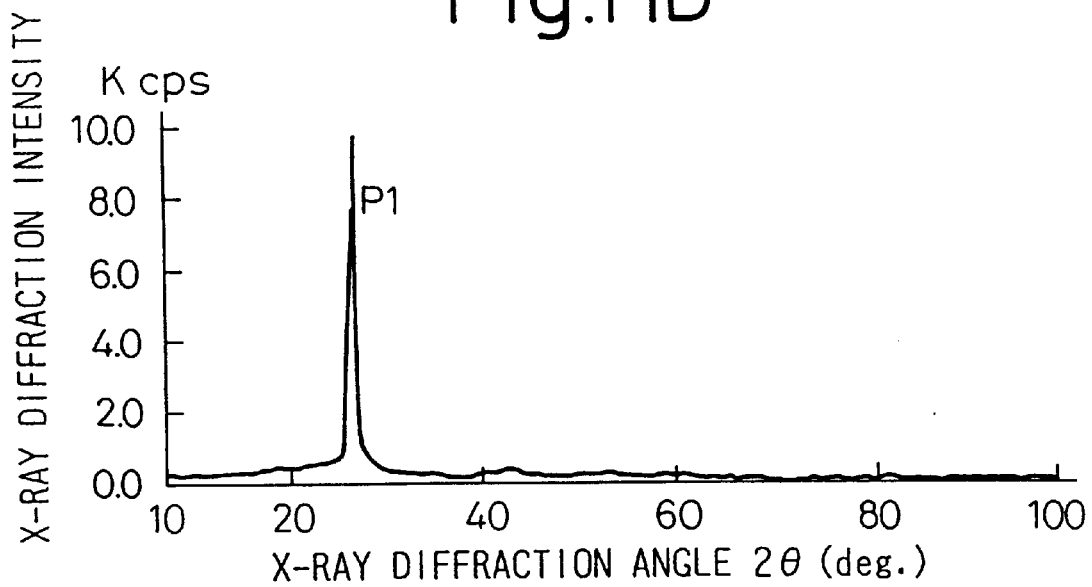

In addition, in the case of a batch system sputtering film growth device as illustrated in FIG. 9 being used, it suffices if the aforesaid pretreatment is carried out in the state such that a shutter 31 is closed. FIG. 9 illustrates a general device, and a simple explanation thereof will be given in the following. A heater 34 is provided on the upper part of a substrate 30, and a shutter 31 is provided between a target 35 and the substrate 30 in order to control the time required for film growth by the sputtering method. Before the film growth, a shelter is provided between the target 35 and the substrate 30, and at the time of the film growth, the shelter is eliminated in order to grow a film onto the substrate. In addition, FIG. 9 is an explanatory view of a sputtering device seen from the side thereof.

The present inventors have confirmed that the pretreatment of the present invention does not always need to be carried out every time for the film growth, but, with the aforesaid treatment conditions, if pretreatment is once carried out, the effect remains for approximately several times (6 times) as long. Subsequently, there is ordinarily carried out heat treatment for improving the crystallinity of the luminescent layer, and, in the present embodiment, by carrying out the aforesaid pretreatment, there is obtained crystallinity higher than the crystallinity improved by an ordinary annealing. Therefore, in the present embodiment, an ordinary annealing becomes unnecessary.

(f) After the luminescent layer 14 was formed, the second insulating layer 15 composed of tantalum pentaoxide ($Ta_2O_5$) was formed on the luminescent layer 14 in the same way as in the case of the first insulating layer 13 being formed.

(g) Subsequently, the second transparent electrode 16 composed of zinc oxide (ZnO) was formed in the same way as in the case of the first transparent electrode 12 being formed. The film thickness of the luminescent layer 14 is 800 nm.

Figure 12:
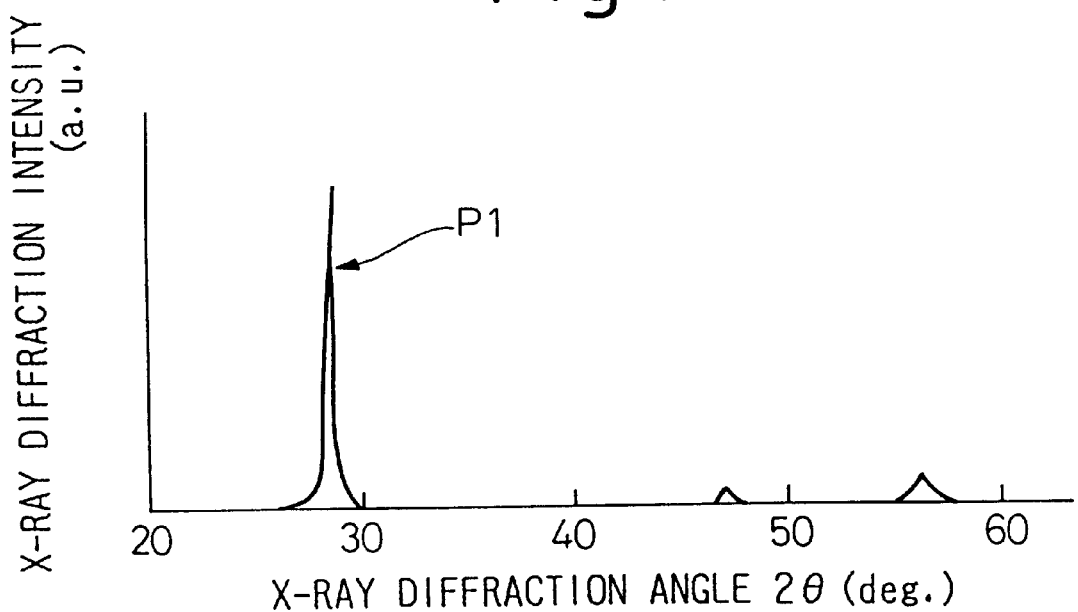
FIG. 12 is a thin film X-ray diffraction spectrum pattern of a luminescent layer thin film subjected to pretreatment with a gas containing chlorine (Cl).

FIG. 12 illustrates the results obtained by subjecting the electroluminescence element produced by the aforesaid process to a measurement by a thin film X-ray diffraction method using Cu-Kd radiation.

In the following, the outline of a thin film X-ray diffraction device will be explained.

FIG. 10 is a rough sketch of a thin film X-ray diffraction device. The thin film X-ray diffraction uses Cu-Kd radiation (wavelength: 0.154 nm) as an X-ray of incidence 47, as a not shown X-ray source. This device is composed mainly of a longitudinal divergence solar slit 41 for limiting the longitudinal divergence as well as incidence slit 42, and a sample mounting plate 43 for setting a substrate 11 such that an X-ray of incidence is incident on the luminescent layer of the EL element (substrate 11) to be used as a sample, a light-intercepting solar slit 44 for improving the angular resolution of an X-ray diffracted from the luminescent layer of the substrate 11, a diffracted X-ray monochrometer 45 for obtaining a diffracted X-ray with a high S/N ratio by eliminating scattered X-rays and white X-rays from the sample, a detector 46 for detecting the intensity of diffracted X-ray, and the like. In FIG. 10, $2\theta_M$ is an angle formed by the direction of a diffracted x-ray that struck against the diffracted x-ray monochrometer 45 and the detector 46.

In the above-mentioned thin film X-ray diffraction device, in order to increase the diffraction intensity from a thin film sample (the luminescent layer 14 of the substrate 11), an X-ray of incidence may be incident close to the sample surface (angle of incidence=1° to 10°). That is, it has been known that when one and the same thin film sample is used, the intensity of diffracted X-ray can be increased by making the angle of incidence α small. For example, by setting the angle of incidence to 4°, the intensity of the diffracted X-ray can be increased to approximately 10 times as much as the intensity obtained when the angle of incidence α is set to 45°.

In addition, in the measurement using the above device, the angle of incidence α is set to an optional value by use of a goniometer (although it is not directly shown in FIG. 10, it is shown as the radius R of the rotatable range thereof), and measurement is conducted with the angle α being unchanged during the measurement. The angle $2\theta_M$ (an angle formed by the direction of a diffracted X-ray that struck against the diffracted X-ray monochrometer 45 and the detector 46) is set in conformity with the characteristic X-ray used, the crystals and surface index of the monochrometer 45, and the once set value is unchanged during the measurement. In the measurement, the value of 2θ (angle of X-ray diffraction) is changed, and the intensities of X-rays at the values of 2θ, and the positions thereof, are detected. In addition, in FIG. 10, the numeral 49 is an incident height-limiting slit, and 50 a width-limiting light-intercepting slit.

FIGS. 11A to 11D are, respectively, an X-ray diffraction spectrum of the luminescent thin film of an EL element produced by way of experiment according to the conventional process, when the angle of incidence α of X-ray is changed to 1.0°, 2.0°, 5.0°, and 10.0°, respectively, and FIGS. 11A to 11D correspond to the aforesaid angle of incidence α=1.0°, 2.0°, 5.0°, and 10.0°, in the named order.

In an ordinary X-ray diffraction measurement (the data in FIG. 14), the incident angle θ and diffraction angle 2θ vary while they are interlocked with each other, and the incident angle is high, for example, in the proximity of a diffraction angle 2θ=28°, the incident angle θ is equal to 14°. On the contrary, in a thin film X-ray diffraction measurement, since the incident angle of X-ray is set to a lower value, there can also be obtained information on the grain boundaries of the thin film, and as illustrated in FIGS. 11A to 11D, a diffraction beam which cannot be seen under ordinary conditions becomes visible. For example, it can be seen that at incident angles of 1.0° and 2.0°, another peak (P2) appears at the left base of the main peak (P1).

FIG. 12 and FIG. 13 show a comparison between the thin film X-ray diffraction spectrum in a luminescent layer of the thin film subjected to pretreatment with a chlorine (Cl)-containing gas according to the production process of the present invention (FIG. 12) and the thin film X-ray diffraction spectrum of a luminescent layer of the thin film which is not subjected to the aforesaid pretreatment by the conventional process (FIG. 13). The incident angle α at this time is 1°. FIG. 13 illustrating a conventional product is a typical view drawn by emphasizing the actually measured result (11A).

As is clear from FIG. 13, in an X-ray diffraction beam of a luminescent layer of the thin film which is not subjected to the aforesaid pretreatment like in the conventional process, not only a main single peak P1 but also another diffraction peak P2 is seen at an X-ray diffraction angle ranging from 25° and 30°, whereas, in the X-ray diffraction beam subjected to the pretreatment with a chlorine (Cl)-containing gas according to the production process of the present invention, as illustrated in FIG. 12, there is observed a single peak P1, and another diffraction peak P2 is not observed. It is considered that the aforesaid main single diffraction peak P1 exhibits the orientation of a (111) plane of a cubic structure, and another diffraction peak P2 exhibits the orientation of a crystal structure other than cubic structure, e.g., the orientation of a (10·0) plane of a hexagonal system.

From the aforesaid results, it is understood that the conventional luminescent layer has a crystal structure wherein a cubic structure and a crystal structure other than a cubic structure are mixed, and it is considered that the conventional layer is present usually as a thin film poor in crystallinity. On the other hand, it is considered that, when the pretreatment of the present invention is carried out, crystal structure other than cubic structure, e.g. the part of the structure of a hexagonal structure is lost, so that the luminescent layer becomes a thin film with good crystallinity.

Figure 15:
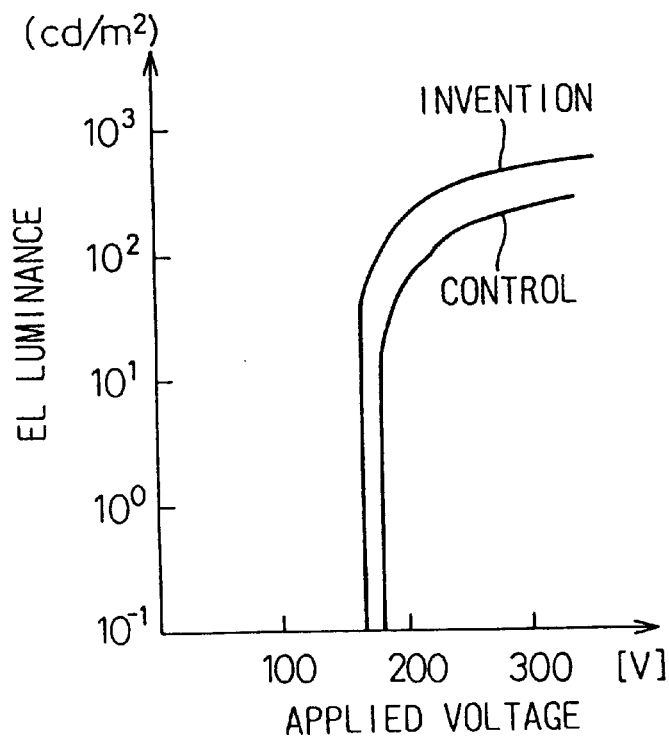
FIG. 15 is a characteristic diagram illustrating the relation between the applied voltage and luminance in an EL element of an embodiment of the present invention and an EL element with a luminescent layer formed according to the conventional production process.

FIG. 15 illustrates a comparison between the relation between the applied voltage $V_{op}$ and luminance L (cd/m$^2$) of the EL element of the aforesaid embodiment and the relation therebetween of a conventional EL element which is not subjected to a pretreatment with a chlorine-containing gas before the formation of the luminescent layer. It has been confirmed that the EL element 100 with a luminescent layer whose crystallinity has been improved by the treatment of the present invention is improved in luminescent efficiency and also improved in luminance by approximately 2 times, as illustrated in FIG. 15.

Figure 16:
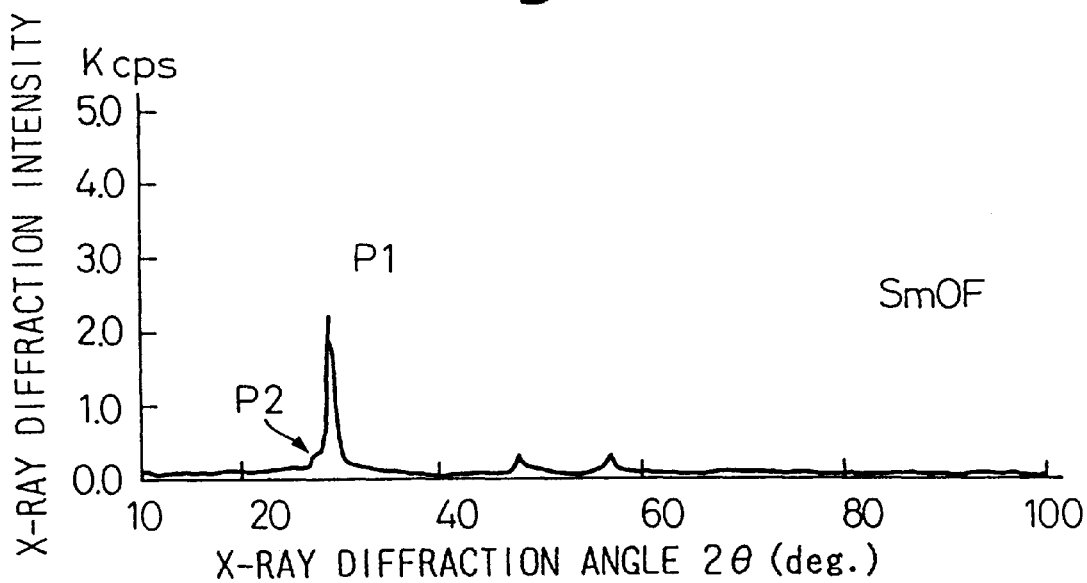
FIG. 16 is a thin film X-ray diffraction spectrum pattern of the luminescent layer of an EL element whose luminescent center material is SmOF, when the pretreatment according to the present invention is not performed.
Figure 17:
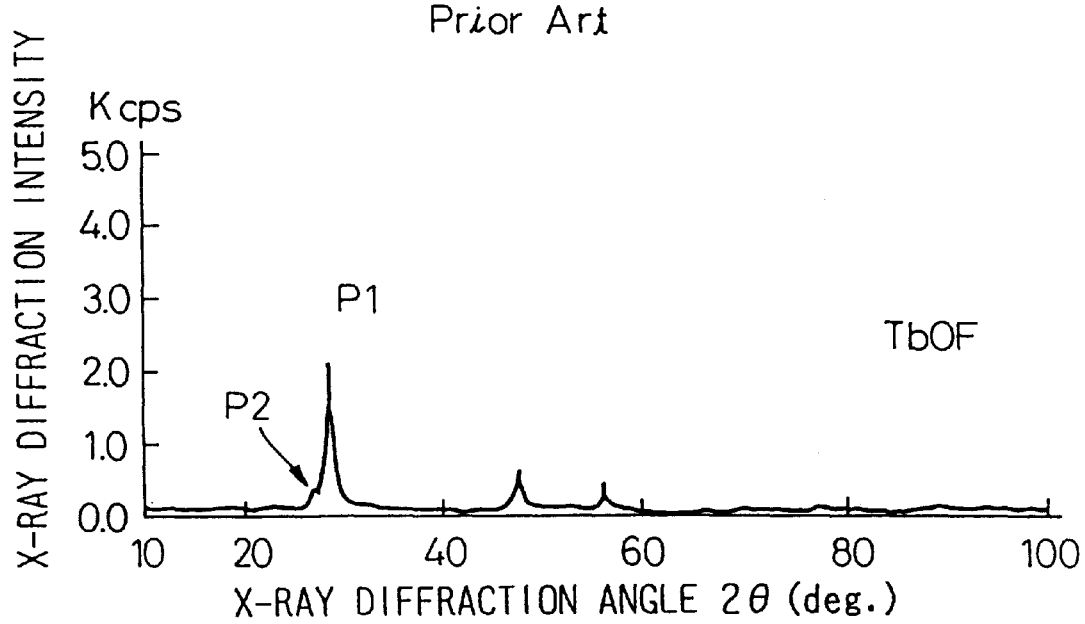
FIG. 17 is a thin film X-ray diffraction spectrum pattern of the luminescent layer of an EL element whose luminescent center material is TbOF, when the pretreatment according to the present invention is not performed.

Although SmF$_3$ was used as the luminescent center material of the aforesaid luminescent layer, SmOF, TbOF or MnF$_2$ may also be used instead of SmF$_3$. FIGS. 16 to 18 slow, a thin film X-ray diffraction spectrum wherein the incident angle α of X-ray is set to 1.0°, for each luminescent center material when the pretreatment of the present invention is not carried out. Even in these luminescent center materials, like SmF$_3$, there is observed, in addition to a main single peak P1, another peak P2 at an X-ray diffraction angle ranging from 25° to 30°. As in SmF$_3$, by carrying out the treatment of the present invention, the other peak P2 became invisible, so that the luminance was improved (The results obtained by the treatment of the present invention for these luminescent center materials are omitted because these results are equivalent to the results illustrated in FIG. 12).

The present invention is not limited to the aforesaid embodiment, and the following modifications are feasible.

(1) Although the first, second, third and fourth insulating layers 13, 15, 23, and 25 are formed of tantalum pentaoxide (Ta$_2$O$_5$), these layers may be formed of Al$_2$O$_3$, Si$_3$N$_4$, Si$_2$, PbTiO$_3$, Y$_2$O$_3$ or a laminate thereof.

(2) The luminescent layers may be laminated in three or more layers besides the first and second layers, e.g. three luminescent layers which are luminescent in red, green, and blue colors, respectively, may be laminated so as to obtain a full-colorized EL element.

(3) Although light was emitted from the direction of both sides of the EL element in the aforesaid embodiment, it is possible to adopt an element constitution wherein light is emitted from the direction of one side.

(4) Although hydrogen chloride (HCl) was used as a chlorine (Cl)-containing gas in the aforesaid embodiment, any material may be used so long as it is a material gas which does not become an impurity even if it remains in the film formation device, e.g., carbon tetrachloride ($CCl_4$)

(5) Although for EL elements produced by the sputtering method discrimination between non-defective and defective elements was carried out by a thin film X-ray diffraction method, the evaluation method of the present invention can be applied even to EL elements obtained by other production processes, and a better production process can be determined.

We claim:

1. An electroluminescence element provided with a luminescent layer sandwiched between two electrodes on an insulating substrate, said luminescent layer being composed of zinc sulfide with a fluoride of a luminescent center element added, wherein the X-ray diffraction spectrum of said luminescent center element has only a single peak at an X-ray diffraction angle from said luminescent layer, ranging from 25° to 30° according to a thin film X-ray diffraction measurement method using Cu-Kd radiation, and no other peaks of the X-ray diffraction spectrum exist at an X-ray diffraction angle of 27°.

2. An element as claimed in claim 1, wherein said fluoride of the luminescent center element is selected from samarium fluoride, terbium oxyfluoride, and manganses fluoride.

3. An element as claimed in claim 1, which exhibits a characteristic that the X-ray diffraction spectrum of said luminescent center element exhibits only a single peak at an X-ray diffraction angle ranging from 25° to 30°.

4. An element as claimed in claim 1, wherein the incident angle of X-ray for said insulating substrate and said luminescent layer is set to a value ranging from 1° to 10°.

* * * * *